(12) United States Patent
Humbel et al.

(10) Patent No.: US 9,418,850 B2
(45) Date of Patent: Aug. 16, 2016

(54) SEMICONDUCTOR DEVICE AND METHOD FOR FORMING A SEMICONDUCTOR DEVICE

(71) Applicant: Infineon Technologies AG, Neubiberg (DE)

(72) Inventors: Oliver Humbel, Maria Elend (AT); Hans Millonig, Feistritz/Gail (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/868,969

(22) Filed: Sep. 29, 2015

(65) Prior Publication Data

US 2016/0111289 A1    Apr. 21, 2016

(30) Foreign Application Priority Data

Oct. 16, 2014    (DE) .......................... 10 2014 115 072

(51) Int. Cl.
| | | |
|---|---|---|
| *H01L 29/36* | (2006.01) | |
| *H01L 21/265* | (2006.01) | |
| *H01L 29/861* | (2006.01) | |
| *H01L 29/66* | (2006.01) | |

(52) U.S. Cl.
    CPC .......... *H01L 21/26513* (2013.01); *H01L 29/36* (2013.01); *H01L 29/6609* (2013.01); *H01L 29/861* (2013.01)

(58) Field of Classification Search
    CPC ....... H01L 29/167; H01L 29/32; H01L 29/36; H01L 29/66136; H01L 29/8611; H01L 29/0619; H01L 29/402; H01L 29/0607; H01L 29/7395; H01L 29/1095; H01L 29/407
    See application file for complete search history.

(56) References Cited

U.S. PATENT DOCUMENTS

| | | | |
|---|---|---|---|
| 4,151,011 | A | 4/1979 | Mihashi et al. |
| 2008/0079119 | A1 | 4/2008 | Inoue |
| 2012/0032305 | A1* | 2/2012 | Kitamura .............. H01L 29/167 257/607 |

FOREIGN PATENT DOCUMENTS

| | | |
|---|---|---|
| DE | 2831035 A1 | 1/1979 |
| DE | 19804580 A1 | 8/1999 |
| DE | 102007026387 A1 | 4/2008 |

* cited by examiner

*Primary Examiner* — Roy Potter
(74) *Attorney, Agent, or Firm* — Murphy, Bilak & Homiller, PLLC

(57) ABSTRACT

A method includes forming an emitter at the first side of a semiconductor substrate by doping, wherein the dopant concentration is higher in the emitter than in the edge region; growing an oxide layer on the first side by annealing, wherein the oxide layer has a first thickness in a first region covering the emitter, and a second thickness in a second region covering the edge region. The first thickness is larger than the second thickness. Heavy metal ions are implanted through the first side with a first energy, and with a second energy, wherein the first energy and the second energy are different, such that the implanted heavy metal concentration in the edge region is higher than in the emitter due to an absorption of the oxide layer covering the emitter, resulting in a lower charge carrier lifetime in the edge region than in the emitter.

15 Claims, 3 Drawing Sheets

SEMICONDUCTOR DEVICE AND METHOD FOR FORMING A SEMICONDUCTOR DEVICE

PRIORITY CLAIM

This application claims priority to German Patent Application No. 10 2014 115 072.4 filed on 16 Oct. 2014, the content of said application incorporated herein by reference in its entirety.

TECHNICAL FIELD

This disclosure relates to semiconductor components, in particular vertical semiconductor components, such as a diode, high-voltage diode, a GTO, or a vertical IGBT (Insulated Gate Bipolar Transistor), having an emitter on one side of a semiconductor substrate.

BACKGROUND

In the edge region of vertical power semiconductor components, such as diodes or IGBTs, dynamic effects, caused by free charge carriers may cause a significant reduction of the blocking capability in said edge region with respect to the ideal breakdown voltage and also with respect to the blocking capability of the active region during the turn-off operation. During the turn-off operation, it may happen, on account of the resulting increased charge carrier concentration in the regions of the edge or the drive terminals, that both the electric field strength in the silicon and the field strengths in $SiO_2$ layers or further insulator layers which have been deposited on the silicon surface for the purpose of passivation or field plate formation in the edge region are greatly increased. By virtue of field strength spikes, an avalanche breakdown in the silicon or a breakdown of the oxide or of the insulator layer may occur there.

Instead of p-rings with field plates, it is also possible to use other edge constructions, such as with p-rings without field plates or VLD edges with an electroactive, semi-insulating or else insulating covering individually or in combination also with further edge terminations known per se.

Several approaches are known in the art to produce inhomogeneous Pt concentrations in order to reduce the density of free charge carriers in combination with variants as above. For example, vertically inhomogeneous Pt concentrations can be produced via phosphorous diffused gettering. However, the resulting profiles are laterally constant. Another variant is the deposition of Pt and a subsequent silicidation. A further variant pertains to an implantation over the frontside of the substrate. However, segregation at oxide layer boundaries can occur in that case.

All of the above variants either require dedicated process steps, are prone to failure or are not suitable to produce varying lateral Pt concentrations. In view of the disadvantages of the prior art outlined above and for other reasons, there is a need for the present invention.

SUMMARY

According to an aspect, a method for fabricating a vertical semiconductor component including a semiconductor substrate with a first side and an edge region is provided. The method comprises forming an emitter at the first side of the semiconductor substrate by doping with a dopant, wherein a dopant concentration of the semiconductor substrate is higher in the emitter than in the edge region; growing an oxide layer on the first side at least partially by annealing, wherein the oxide layer has a first thickness in a first region covering the emitter, and wherein the oxide layer has a second thickness in a second region covering the edge region, and wherein the first thickness is larger than the second thickness; Implanting heavy metal ions through the first side with a first energy; Implanting heavy metal ions through the first side with a second energy; wherein the first energy and the second energy are differently chosen, such that the implanted heavy metal concentration in the edge region is higher than in the emitter due to an absorption of a part of the heavy metal ions with the lower energy in the first region of the oxide layer covering the emitter, resulting in a lower charge carrier lifetime in the edge region than in the emitter.

According to a further aspect, a vertical semiconductor component including a semiconductor substrate with a first side and an edge region is provided. The semiconductor component comprises an emitter formed on the first side of the semiconductor substrate, wherein the emitter is laterally surrounded by the edge region; a contact formed on the first side of the semiconductor substrate, the contact at least partly covering the emitter; and wherein the emitter and the edge region comprise implanted heavy metal atoms acting as recombination centers, and wherein a heavy metal concentration in the edge region is higher than in the emitter.

In a yet further aspect, an intermediate product in the production process of a vertical semiconductor component is provided. The intermediate product has a semiconductor substrate and an edge region and further comprises an emitter including a dopant, wherein the dopant concentration is higher in the emitter than in the edge region; an oxide layer provided on a first side of the semiconductor substrate at least partially by annealing, wherein the oxide layer has a first thickness in a first region covering the emitter, and wherein the oxide layer has a second thickness in a second region covering the edge region; and wherein the first thickness is larger than the second thickness, wherein an implanted heavy metal concentration in the edge region is higher than in the emitter.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
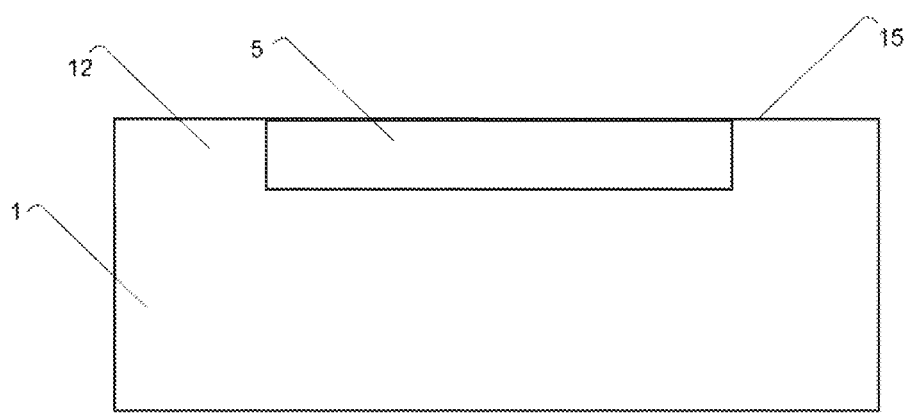
FIG. 1 to FIG. 5 illustrate a method according to embodiments, thereby showing intermediate products and semiconductor devices according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, semiconductor diodes, in particular bipolar semiconductor diodes, and methods for forming semiconductor diodes. Typically, the semiconductor diode is a high voltage diode having an active area for carrying and/or rectifying a load current and a peripheral area having an edge-termination structure. Generally, the terms "semiconductor device" and "semiconductor component" are used interchangeably herein.

The term "high voltage diode" as used in this specification intends to describe a semiconductor diode on a single chip with high voltage and/or high current switching capabilities. Typically, the high voltage diode has a rating for reverse voltages of, in particular, above about 400 V and preferably above about 1000 V or even above 1.5 kV.

To reduce the intensity of the electric fields near the edge of a rectifying junction (e.g. pn-junction), high voltage semiconductor devices may include an edge-termination structure in a peripheral area arranged around an active area. The term "edge-termination structure" as used in this specification intends to describe a structure that provides a transition region in which the high electric fields around the active area of the semiconductor device change gradually to the potential at the edge of the device. The edge-termination structure may, for example, lower the field intensity around the termination region of the rectifying junction by spreading the electric field lines across the termination region.

In the context of the present specification, the terms "field plate" and "field electrode" intend to describe an electrode which is arranged next to a pn-junction and configured to expand a depleted portion of at least one of the semiconductor regions forming the pn-junction by applying an appropriate voltage. The field plate may be insulated from the semiconductor region or in electric contact with at least one of the semiconductor regions. To operate the field plate as an edge-termination structure, a voltage applied to a p-type semiconductor region forming a pn-junction with an n-type semiconductor region is also applied to the field plate. The p-type semiconductor region may form an anode region of a semiconductor diode or may form a further p-type semiconductor region embedded in the n-type semiconductor region. The further p-type semiconductor region may, for example, be formed as an island, a stripe, and a closed substantially ring-shaped area when seen from top. A single semiconductor diode may have one or more field plates which may be on different voltages.

In the context of the present specification, the terms "depleted" and "completely depleted" intend to describe that a semiconductor region comprises substantially no free charge carriers.

In the context of the present specification, the terms "energy" and "implantation energy" may be used interchangeably and pertain to the kinetic energy of ions which are implanted into a semiconductor substrate.

In the context of the present specification, the term "metallization" intends to de-scribe a region or a layer with metallic or near metallic properties with respect to electric conductivity. A metallization may be in contact with a semiconductor region to form an electrode, a pad and/or a terminal of the semiconductor device. The metallization may be made of or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, PtSi, $CoSi_2$, $WSi_2$ or the like. The metallization may also include different electrically conductive materials, for example a stack of those materials.

Generally, embodiments pertain to a semiconductor device and a method for producing the same. The semiconductor device includes a semiconductor substrate with a first side and an edge region. An emitter is formed on the first side of the semiconductor substrate by doping with a dopant, for example phosphorous. The dopant concentration is higher in the emitter region than in the edge region. Subsequently, an oxide layer is formed on the first side, typically this is at least partially carried out by annealing. The oxide layer grows with differing growth rates in the emitter region and the edge region. This is due to an influence of the dopant concentration on the growth of the oxide layer. The resulting oxide layer has thus a first, greater thickness in a first region covering the emitter region. The oxide layer further has a second, smaller thickness in a second region covering the edge region. Thus, the semiconductor substrate has an oxide layer with different thicknesses, the greater thickness being located over the emitter region.

This varying oxide layer thickness, having at least two regions with different thicknesses, is then used to influence the deposition of heavy metal ions by implantation, which may typically be, for example, Pt, Au, or other suitable metals. The ions are implanted over the first side of the semiconductor substrate on which the emitter is located. At least two implantation energy levels of the heavy metal ions are employed during the implantation process. With a first implantation energy, heavy metal ions are implanted into the semiconductor substrate through the oxide layer. The first implantation energy is chosen so that a deposition peak occurs at a first depth from the surface of the substrate, which is determined such that the majority of the ions hitting the area where the emitter is located—covered with the thicker oxide layer—are deposited to the biggest extent in the oxide layer and do not reach the emitter underneath the oxide layer. In contrast thereto, the heavy metal ions reaching the substrate in the edge region, being covered with the oxide layer with smaller thickness, mainly cross that oxide layer without interference and thus are mainly deposited in the edge region of the substrate underneath the oxide layer. That is, the implanted/deposited heavy metal ion concentration in the edge region is higher than in the emitter region, due to the absorption of the ions with the lower energy in the oxide layer with the first (and greater) thickness covering the emitter region. This implantation step results in a reduced charge carrier lifetime in the edge region in comparison to the status before the implantation, and also in comparison to the emitter region.

In a further, second implantation step, heavy metal ions—typically, but not necessarily of the same type as used in the procedure described above—are deposited with a second, higher energy. This second energy is chosen so that the heavy metal ions do not only cross, or transmit through, the thinner oxide layer covering the edge region, but also cross the thicker oxide layer covering the emitter region without interference, or only with minimal interference. Thus, the ions from the second implantation step, in both the emitter region and the edge region, transmit through the oxide layer without significant interference and are stopped and thus deposited only in the regions under the oxide layer, that is in the edge region, and in the emitter region. Hence, the heavy metal ion concentration in the edge region is further increased from the level resulting from the first implantation described above, and the concentration in the emitter region is also raised. Thereby, the parameters of the second implantation are typically chosen to mainly, respectively foremost, control the charge carrier lifetime in the emitter region, but at the same time also the charge carrier lifetime in the edge region is influenced. After both the first implantation step and the second implantation step are finished, that is, when ions have been deposited with at least two different energies, the semiconductor substrate has to be annealed in order to activate the implanted heavy metal ions in the substrate.

Conclusively, it can be seen that by varying the employed ion energies in the first and second implantation steps, the intensity and duration of the respective implantations, and the thicknesses of the oxide layer covering the semiconductor substrate, the charge carrier lifetime both in the emitter region and the edge termination region may in embodiments be varied with a very high flexibility. It is understood that methods according to embodiments, as described above, may be used in the production of a wide range of semiconductor devices, and to achieve semiconductor devices having very different characteristics, as the charge carrier lifetime in the different regions can be used to influence a number of properties and characteristics. Thereby, parameters influencing the deposition characteristics in the various target areas such as the emitter and the edge region are the two differing thicknesses of the oxide layer and also the two differing energies of the deposited ions, amongst others.

It is understood that the skilled person may readily calculate deposition rates and achieved target concentrations and profiles, depending on the semiconductor materials used and the type of heavy metal ions employed, by well-known numerical simulation methods. It shall be noted that, as the deposition depth, reach of the ions, etc., significantly vary depending on the type of deposited ions and the type of target materials, in this disclosure it is mainly emphasized how deep the ions shall be deposited with reference to the thickness of the oxide layer, for example, as the deposition depth is one of the factors which need to be taken into account in methods according to embodiments.

When exchanging Pt with Au as the deposited heavy metal ions, for example, the same oxide layer thicknesses and same deposition energies would yield significantly different deposition results, and thus these parameters would have to be adapted in order to achieve useful results with a different ion type.

FIGS. 1 to FIG. 5 illustrate a method according to embodiments. The semiconductor device which is produced with the described method may be a diode, for example, in particular a high voltage diode. Also a variety of other semiconductor devices having an emitter region 5 and an edge region 12 may be produced employing the methods according to embodiments, such as an IGBT or a GTO, as non-limiting examples.

FIG. 1 shows a semiconductor substrate 1 with a first side 15, which is used in a method according to embodiments. On the first side 15 of the semiconductor substrate 1, an emitter 5 is formed. This is typically carried out by doping with a dopant, for example an n-dopant such as phosphorous. Typically, the phosphorous concentration is higher in the emitter region than in a region surrounding the emitter 5, herein called edge region 12. More typically, the dopant concentration in the edge region 12 is very low or near zero, in comparison to the emitter 5.

Figure 2:
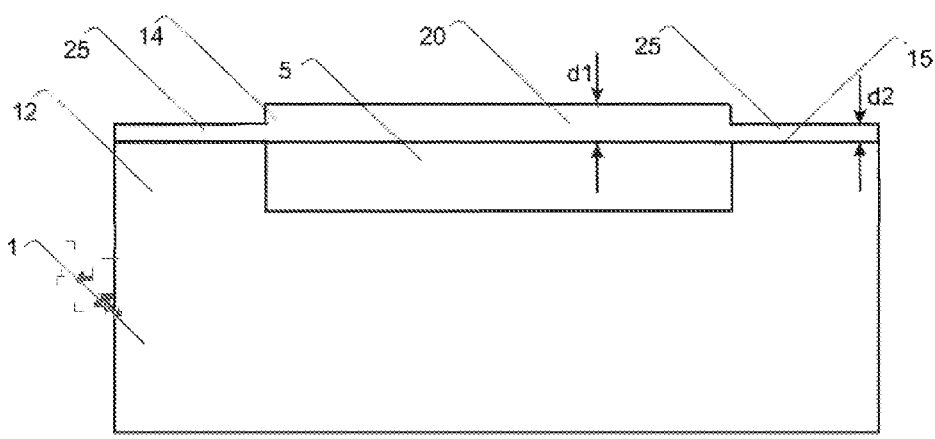

In FIG. 2, it is shown that an oxide layer 14 with a first region 20 covering the emitter 5, and with a second region 25 covering the edge region 12 is provided. The oxide layer 14 is typically provided by a thermal process such as annealing, whereby a layer of oxide grows on the surface of the first side 15 of the semiconductor substrate 1. Thereby, the emitter 5 region doped with, as a non-limiting example, phosphorous, promotes the oxide growth by approximately a factor of two in comparison to a growth in the non-phosphorous-doped edge region 12. Consequently, after some time of heating, or more precisely annealing, the first thickness d1 of the first region 20 of the oxide layer 14 is greater, typically about double as great as the second thickness d2 of the second region 25 of the oxide layer 14. This is exemplarily shown in FIG. 2. It shall be emphasized here that the differing thicknesses are a result which comes naturally when applying the process according to embodiments, and do not have to be promoted by dedicated extra measures such as photo masks etc. The differing thicknesses of the first region 20 and the second region 25 of the oxide layer 14 are subsequently employed as a kind of mask, or more precisely as an ion-energy-dependent absorber, for depth-selective ion implantation into the semiconductor substrate 1. The individual composition of the oxide layer 14 may differ from the structure described hereinbefore, and the formation of the oxide layer 14 may in embodiments include further process steps additionally to the annealing, which is described further below.

Figure 3:
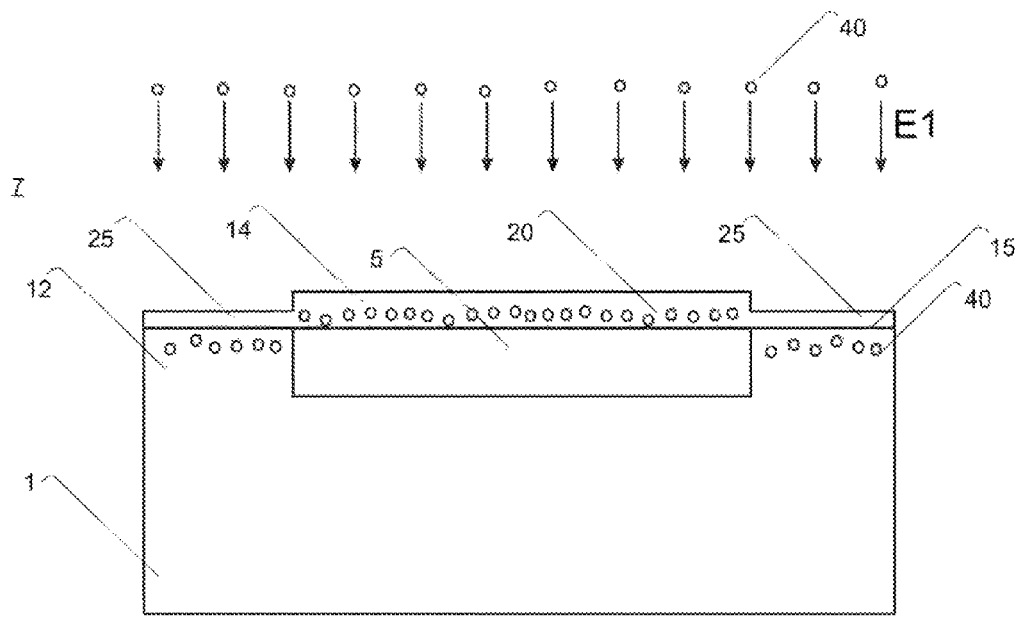

In FIG. 3, it is shown how heavy metal ions 40, in the example Pt ions, are implanted into the semiconductor substrate 1 over the first side 15 with a first implantation energy E1, according to embodiments. E1 is chosen so that the heavy metal ions 40 reaching the first region 20 of the oxide layer 14 are almost entirely absorbed in the oxide layer 14, and thus do not reach the emitter 5 underneath it. However, in the edge region 12, the second region 25 of the oxide layer 14 is thinner than in the first region 20 covering the emitter 5, so that the greatest part of the heavy metal ions 40 can transmit the second region 25 of the oxide layer 14 and reach the edge region 12 of the semiconductor substrate 1 underneath it. The heavy metal ions 40 are thus deposited in the edge region 12 and locally reduce the charge carrier lifetime in the edge region 12, after a subsequent annealing is carried out to activate the heavy metal ions 40 in the lattice of the semiconductor substrate 1. It is understood that the first implantation energy E1 and the two different thicknesses of the first region 20 and the second region 25 of the oxide layer 14 have to be chosen accordingly in order to achieve the above deposition behavior.

Figure 4:
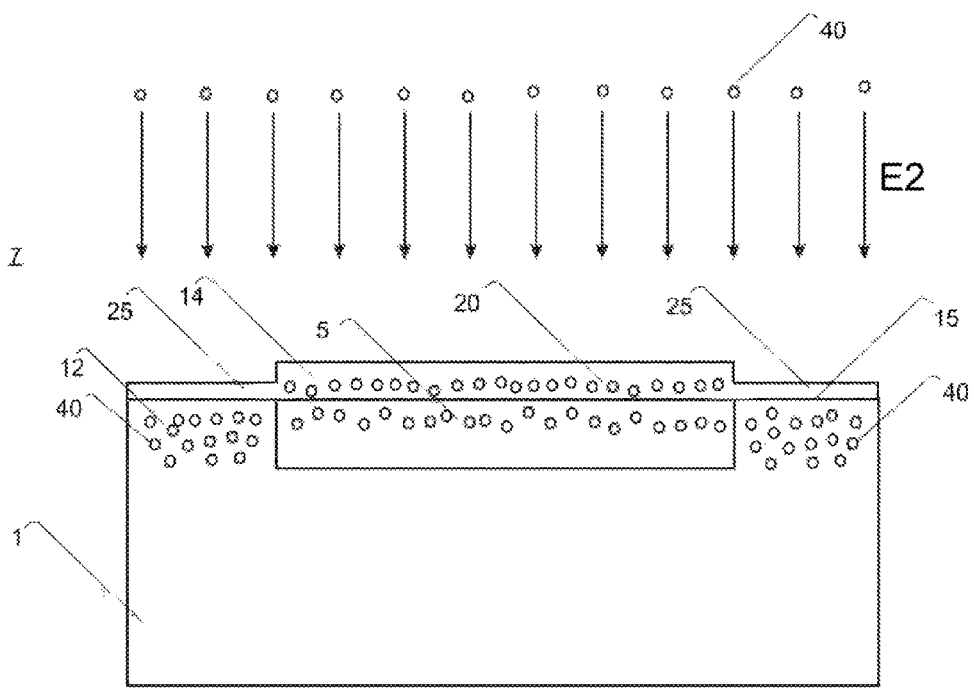

In FIG. 4, it is shown how heavy metal ions 40 are implanted into the semiconductor substrate 1 over the first side 15 with a second implantation energy E2, according to embodiments. E2 is chosen so that the heavy metal ions 40 reaching the first region 20 of the oxide layer 14 have enough kinetic energy to transmit through the thicker first region 20 of the oxide layer 14, and thus the majority of the ions with the second implantation energy E2 reach the emitter 5 underneath it. In the edge region 12, the second region 25 of the oxide layer 14 is thinner than in the first region 20 covering the emitter 5, so that the heavy metal ions 40 transmit the second region 25 of the oxide layer 14 and reach the edge region 12 of the semiconductor substrate 1. The heavy metal ions 40 with the second energy E2 are thus also deposited in the edge region 12 and further locally reduce the charge carrier lifetime in the edge region 12, after an annealing is carried out to activate the heavy metal ions in the lattice of the semiconductor substrate 1.

Typically, in embodiments, one of the first energy E1 and the second energy E2 is chosen such that the range of the respective heavy metal ions 40 is smaller than the first thickness d1 of the first region of the oxide layer 14, but greater than the second thickness d2 of the second region 25. This provides that the majority of heavy metal ions 40 with the first energy E1 does not reach the emitter 5 region through the oxide layer 14 with the first thickness in the first region 20, but reaches the edge region 12 through the oxide layer 14 with the smaller second thickness in the second region 25. The other one of the first energy and the second energy is chosen so that the range of the respective heavy metal ions 40 is greater than the first thickness in the first region 20 and also greater than the second thickness in the second region 25, such that heavy metal ions 40 may reach both the emitter 5 region and the edge region 12 through the oxide layer 14.

Figure 5:
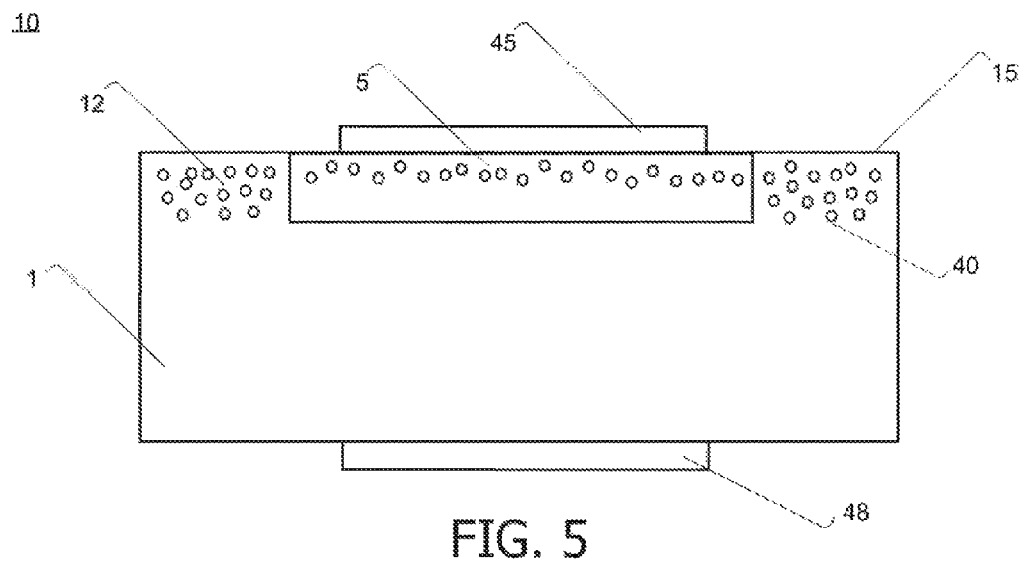

After the implantation steps described with respect to FIG. 3 and FIG. 4 above, the oxide layer 14 is typically removed completely. This may be carried out by a selective wet-etching, for example, or by other suitable measures known to the skilled person, such as for example CMP. The resulting semiconductor device 10, further equipped with a first contact layer 45 in contact with the emitter 5, and a second contact layer 48 in contact with the body of the semiconductor substrate 1, is shown in FIG. 5. In embodiments, the semiconductor device 10 shown in FIG. 5 may further be provided with elements for expanding a depletion portion of at least one of the semiconductor regions forming a pn-junction, namely a field plate or a field electrode. The field plate/electrode may be insulated from the semiconductor substrate 1 and emitter 5, or be in electric contact with at least one of these regions. To operate the field plate/electrode as an edge-termination structure, a voltage applied is also applied to the field plate. Also, more field plates may be provided, which may be on different voltages.

Figure 6:
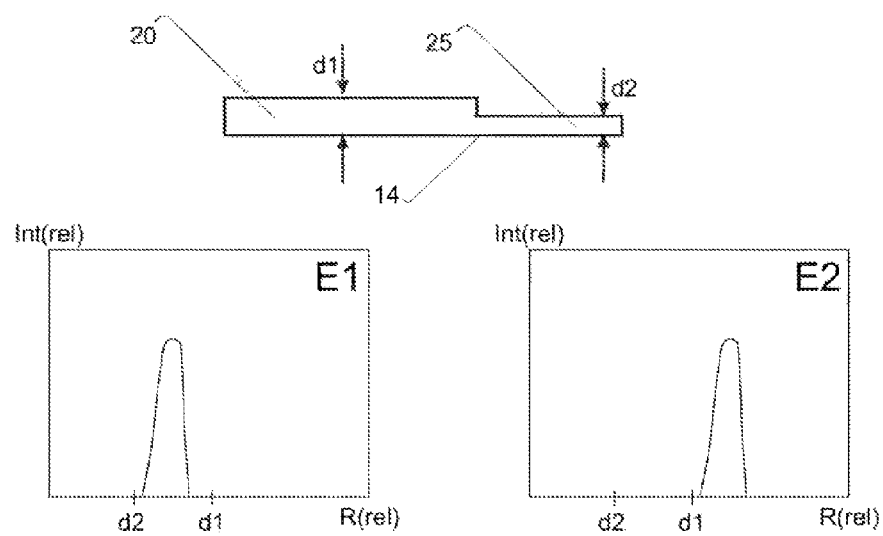
FIG. 6 illustrates an implantation with two different energies, according to a method according to embodiments.

In FIG. 6, the relation between the first energy E1 and the second energy E2 employed in the implantation of the heavy metal ions 40, such as described above with respect to FIG. 3 and FIG. 4, is shown in greater detail according to embodiments. In the upper part of FIG. 6, a partial view of the oxide layer 14, as was first described with respect to FIG. 2, is shown. The oxide layer 14 has two regions, a first region 20 having a first thickness d1, and a second region 25 having a second thickness d2. Thereby, d1 is significantly greater as d2, at least by about a factor of 1.5 or more, more preferably by a factor of about 2 to 3, or greater. At energy E1 depicted in the left diagram, it can be seen that the peak symbolizing the number of ions reaching a certain impact depth has a maximum between d1 and d2. This means that the greatest number of ions will transmit through the second region 25 of the oxide layer 14 having the smaller thickness d2. However, ions with energy E1 have a smaller reach than d1, meaning they are stopped and absorbed in the first region 20 with thickness d1. Turning to the right diagram of FIG. 6, ions having the larger energy E2 have a reach which exceeds both d1 and d2, thus the heavy metal ions 40 transmit through the oxide layer 14 in both the first region 20 with thickness d1 and the second region 25 with thickness d2.

In embodiments, the heavy metal ions may include one of Pt or Au. As a dopant for the emitter 5, generally known dopants can be chosen having the opposite characteristic to the dopant of the semiconductor substrate 1.

In exemplary, non-limiting embodiments pertaining to a high voltage pn-diode with a rated voltage of about 1 kV to about 7 kV, the first thickness d1 of the first region 20 of the oxide layer 14 is from about 30 nm to about 40 nm. The second thickness d2 of the second region 25 of the oxide layer 14 is from about 10 to about 20 nm. The peak depth of the first implantation energy E1 is from about 25 to about 35 nm, and the peak depth of the second implantation energy is from about 50 to about 70 nm. These values correspond to a first implantation energy E1 from about 30 to about 40 keV, whereby a second implantation energy E2 is from about 130 to about 160 keV, all values pertaining to Pt as deposited ions.

Generally, in embodiments the described implantations are carried out in an implantation limited manner, in contrast to a diffusion limiting manner. The vertical semiconductor device 10 may in embodiments for example be a diode, a high-voltage diode, an IGBT, a GTO, or any other semiconductor device which may be produced with a method including method steps, or variations thereof, as shown with respect to FIG. 1 to FIG. 5.

The oxide layer 14 may be produced by annealing the semiconductor substrate 1 at a temperature of, for example, about 600° C. to about 900° C. The oxide layer may alternatively be produced by a process employing TEOS. Also, a first part of the oxide layer 14 may be produced by annealing, and a second part (layer) may be produced by a further method such as TEOS.

Generally, regarding the whole range of possible applications of the disclosed methods in the production of different semiconductor devices, the first thickness of the oxide layer 14 may be from about 20 nm to about 600 nm, and the second thickness of the oxide layer 14 may be from about 10 to about 300 nm. The first energy E1 and the second energy E2 may both be in the range from about 30 keV to about 300 keV when employing Pt as the heavy metal ions.

In embodiments, an intermediate product 7 from the production process of a vertical semiconductor component 10 is provided. It comprises a substrate 1 and an edge region 12. It further comprises an emitter 5 region including a phosphorous dopant, wherein the phosphorous concentration is higher in the emitter 5 region than in the edge region 12, an oxide layer 14 on a first side 15 of the intermediate product, formed by annealing, wherein the oxide layer 14 has a first thickness d1 in a first region 20 covering the emitter 5 region. The oxide layer 14 has a second thickness d2 in a second region 25 covering the edge region 12. The first thickness d1 is larger than the second thickness d2, and an implanted heavy metal ion concentration in the edge region 12 is higher than in the emitter 5 region.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method for fabricating a semiconductor component including a semiconductor substrate with a first side and an edge region, the method comprising:
   forming an emitter at the first side of the semiconductor substrate by doping with a dopant, wherein a dopant concentration of the semiconductor substrate is higher in the emitter than in the edge region,
   growing an oxide layer on the first side, at least partially by annealing, wherein the oxide layer has a first thickness in a first region covering the emitter, and wherein the oxide layer has a second thickness in a second region covering the edge region; and
   wherein the first thickness is larger than the second thickness,
   implanting heavy metal ions through the first side with a first energy, and
   implanting heavy metal ions through the first side with a second energy, wherein the first energy and the second energy are differently chosen, such that the implanted heavy metal concentration in the edge region is higher than in the emitter due to an absorption of a part of the heavy metal ions with the lower energy in the first region of the oxide layer covering the emitter, resulting in a lower charge carrier lifetime in the edge region than in the emitter.

2. The method of claim 1, wherein one of the first energy and the second energy is chosen such that the range of the respective heavy metal ions is smaller than the first thickness and greater than the second thickness, such that the majority of heavy metal ions with this implantation energy does not reach the emitter through the oxide layer with the first thickness, but reaches the edge region through the oxide layer with the second thickness in the second region.

3. The method of claim 2, wherein the other one of the first energy and the second energy is chosen so that the range of the respective heavy metal ions is greater than the first thickness and greater than the second thickness, such that the majority of the heavy metal ions reach the emitter and the edge region by transmitting through the oxide layer.

4. The method of claim 1, wherein the heavy metal includes Pt or Au, and wherein the dopant is phosphorous.

5. The method of claim 1, wherein the first thickness of the oxide layer in the first region is at least about 1.5 times the second thickness of the oxide layer in the second region.

6. The method of claim 1, wherein the first thickness of the oxide layer is from about 20 nm to about 600 nm, and the second thickness of the oxide layer is from about 10 nm to about 300 nm.

7. The method of claim 1, wherein the first energy and the second energy are both in the range from about 30 keV to about 300 keV, and wherein the heavy metal comprises Pt.

8. The method of claim 1, wherein the implantation is carried out in an implantation limited manner.

9. The method of claim 1, wherein the vertical semiconductor is a diode, a high-voltage diode, an IGBT, or a GTO.

10. The method of claim 1, wherein the oxide layer is at least partially produced by annealing at a temperature of about 600° C. to about 900° C.

11. The method of claim 1, wherein the oxide layer is at least partially produced by a process employing TEOS.

12. A vertical semiconductor component including a semiconductor substrate with a first side and an edge region, the semiconductor component comprising:
   an emitter formed on the first side of the semiconductor substrate, wherein the emitter is laterally surrounded by the edge region;
   a contact layer formed on the first side of the semiconductor substrate, the contact layer at least partly covering the emitter; and
   wherein the emitter and the edge region comprise implanted heavy metal atoms acting as recombination centers, and wherein a heavy metal concentration in the edge region is higher than in the emitter.

13. The vertical semiconductor component of claim 12, wherein the semiconductor component is an IGBT, a diode, a high voltage diode, or a GTO.

14. An intermediate product in the production process of a vertical semiconductor component, comprising a semiconductor substrate, and an edge region, comprising:
   an emitter including a dopant;
   an oxide layer provided on a first side of the semiconductor substrate at least partially by annealing, wherein the oxide layer has a first thickness in a first region covering the emitter, and wherein the oxide layer has a second thickness in a second region covering the edge region; and wherein the first thickness is larger than the second thickness, and wherein an implanted heavy metal concentration in the edge region is higher than in the emitter.

15. The intermediate product of claim 14, wherein the implanted heavy metal concentration in the edge region is at least about as double as high than in the emitter.

* * * * *